(12) United States Patent
Nayak et al.

(10) Patent No.: US 11,439,039 B2
(45) Date of Patent: Sep. 6, 2022

(54) THERMAL MANAGEMENT OF ELECTRONIC DEVICES ON A COLD PLATE

(71) Applicant: Hamilton Sundstrand Corporation, Charlotte, NC (US)

(72) Inventors: Hebri Vijayendra Nayak, Rockford, IL (US); Scott C. Wohlfarth, Edgerton, WI (US); Michael Anthony Futrell, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 17/113,817

(22) Filed: Dec. 7, 2020

(65) Prior Publication Data

US 2022/0183182 A1 Jun. 9, 2022

(51) Int. Cl.
*H05K 7/20* (2006.01)
(52) U.S. Cl.
CPC ..... *H05K 7/20254* (2013.01); *H05K 7/20281* (2013.01)
(58) Field of Classification Search
None
See application file for complete search history.

(56) References Cited

U.S. PATENT DOCUMENTS

| | | | |
|---|---|---|---|
| 5,349,498 A * | 9/1994 | Tanzer | H01L 23/473 361/689 |
| 6,917,103 B2 | 7/2005 | Hirano et al. | |
| 7,876,561 B2 * | 1/2011 | Schnetzka | H05K 7/20936 361/699 |
| 8,018,047 B2 | 9/2011 | Bayerer et al. | |
| 8,149,579 B2 * | 4/2012 | Jadric | H05K 7/20936 257/714 |
| 8,929,071 B2 | 1/2015 | Beaupre et al. | |
| 9,269,644 B2 | 2/2016 | Nishimura et al. | |
| 9,520,305 B2 | 12/2016 | Kulas | |
| 9,860,987 B2 * | 1/2018 | Singh | H01L 23/473 |
| 9,980,415 B2 * | 5/2018 | Zhou | H05K 7/20927 |
| 10,770,380 B2 | 9/2020 | Kimura et al. | |
| 11,129,305 B2 * | 9/2021 | Raeth | H05K 7/20409 |
| 2010/0314072 A1 | 12/2010 | Lee et al. | |
| 2012/0006383 A1 * | 1/2012 | Donnelly | H02S 40/44 136/246 |
| 2012/0113598 A1 * | 5/2012 | Toh | H01L 23/473 361/715 |
| 2016/0056088 A1 | 2/2016 | Uhlemann et al. | |

(Continued)

FOREIGN PATENT DOCUMENTS

| | | |
|---|---|---|
| CN | 106098648 A | 11/2016 |
| JP | 200550919 A | 2/2005 |

(Continued)

OTHER PUBLICATIONS

Extended European Search Report for EP Application No. 21212566.0, dated May 11, 2022, pp. 1-7.

*Primary Examiner* — Courtney L Smith
(74) *Attorney, Agent, or Firm* — Cantor Colburn LLP

(57) ABSTRACT

A cold plate includes a first side with a first surface, and a second side, opposite the first side. A coolant cavity is formed between the first side and the second side. A recessed base is machined into the first surface of the first side. The recessed base is bonded to a base copper plate and is a thinnest portion of the first surface.

16 Claims, 11 Drawing Sheets

(56) References Cited

U.S. PATENT DOCUMENTS

| | | | |
|---|---|---|---|
| 2019/0326262 A1 | 10/2019 | Tanaka et al. | |
| 2020/0383238 A1* | 12/2020 | Chan | H05K 7/20281 |
| 2021/0233885 A1 | 7/2021 | Umeda et al. | |
| 2022/0013431 A1* | 1/2022 | Zhou | H01L 23/3735 |

FOREIGN PATENT DOCUMENTS

| | | | |
|---|---|---|---|
| JP | 2005285885 A | 10/2005 | |
| JP | 2006351834 A | 12/2006 | |
| WO | 2020208741 A1 | 5/2021 | |

* cited by examiner

THERMAL MANAGEMENT OF ELECTRONIC DEVICES ON A COLD PLATE

BACKGROUND

Exemplary embodiments pertain to the art of thermal management and, in particular, to thermal management of electronic devices on a cold plate.

A liquid cold plate is a platform for mounting power electronic components. The cold plate provides localized cooling to the components by transferring heat from the components mounted on one or both surfaces to the liquid flowing within. Electronic devices, such as power dies and diodes, are used in a broad range of applications. When the installation of these devices facilitates exposure to the ambient atmosphere, convective heat transfer can be used to cool these heat-generating devices. However, based on the specific application, such exposure and, thus, the resultant convective heat transfer is not possible. In these cases, conductive thermal management must be employed.

BRIEF DESCRIPTION

In one embodiment, a cold plate includes a first side with a first surface, and a second side, opposite the first side. A coolant cavity is formed between the first side and the second side, and a recessed base is machined into the first surface of the first side. The recessed base is bonded to a base copper plate and is a thinnest portion of the first surface.

Additionally or alternatively, in this or other embodiments, the cold plate also includes an inlet to channel coolant into the coolant cavity on a first side of the coolant cavity.

Additionally or alternatively, in this or other embodiments, the cold plate also includes an outlet to channel the coolant out of the coolant cavity on a second side, opposite the first side, of the coolant cavity.

Additionally or alternatively, in this or other embodiments, the cold plate also includes a base edge machined into the first surface of the first side, wherein the base edge forms a border around a perimeter of the recessed base.

Additionally or alternatively, in this or other embodiments, the base edge is less recessed from the first surface than the recessed base.

Additionally or alternatively, in this or other embodiments, the cold plate also includes a recessed edge machined into the first surface of the first side, wherein the recessed edge forms a border around a perimeter of the base edge.

Additionally or alternatively, in this or other embodiments, the recessed edge is less recessed from the first surface than the base edge.

Additionally or alternatively, in this or other embodiments, the recessed edge includes holes corresponding to fasteners configured to fasten an electronic assembly seated on the recessed base to the cold plate.

Additionally or alternatively, in this or other embodiments, the cold plate is machined from aluminum.

Additionally or alternatively, in this or other embodiments, the cold plate is machined from aluminum alloy.

In another embodiment, a method of fabricating a cold plate includes machining a coolant cavity between a first side with a first surface and a second side, opposite the first side. The method also includes machining a recessed base into the first surface of the first side. The recessed base is bonded to a base copper plate and is a thinnest portion of the first surface.

Additionally or alternatively, in this or other embodiments, the method also includes forming an inlet to channel coolant into the coolant cavity on a first side of the coolant cavity.

Additionally or alternatively, in this or other embodiments, the method also includes forming an outlet to channel the coolant out of the coolant cavity on a second side, opposite the first side, of the coolant cavity.

Additionally or alternatively, in this or other embodiments, the method also includes machining a base edge into the first surface of the first side, wherein the base edge forms a border around a perimeter of the recessed base.

Additionally or alternatively, in this or other embodiments, the machining the base edge includes machining the base edge to be less recessed from the first surface than the recessed base.

Additionally or alternatively, in this or other embodiments, the method also includes machining a recessed edge into the first surface of the first side, wherein the recessed edge forms a border around a perimeter of the base edge.

Additionally or alternatively, in this or other embodiments, the machining the recessed edge includes machining the recessed edge to be less recessed from the first surface than the base edge.

Additionally or alternatively, in this or other embodiments, the method also includes forming holes in the recessed edge corresponding to fasteners configured to fasten an electronic assembly seated on the recessed base to the cold plate.

Additionally or alternatively, in this or other embodiments, the fabricating the cold plate includes machining aluminum or aluminum alloy.

In yet another embodiment, a system includes a cold plate that includes a first side with a first surface, and a second side, opposite the first side. The cold plate also includes a coolant cavity formed between the first side and the second side, and a recessed base machined into the first surface of the first side. The recessed base is bonded to a base copper plate and is a thinnest portion of the first surface. The system also includes an electronic assembly seated on the recessed base, the electronic assembly including the base copper plate, power dies, and diodes.

BRIEF DESCRIPTION OF THE DRAWINGS

The following descriptions should not be considered limiting in any way. With reference to the accompanying drawings, like elements are numbered alike:

FIGS. 1 to 7 details aspects of a cold plate assembly that provides thermal management of electronic devices according to one or more embodiments, in which:

FIG. 1 is an isometric view of an exemplary cold plate assembly according to one or more embodiments;

FIG. 5 is an expanded view of aspects of the cross-sectional view shown in FIG. 4B;

FIG. 7 is a cross-sectional view of aspects of the cold plate.

DETAILED DESCRIPTION

A detailed description of one or more embodiments of the disclosed apparatus and method are presented herein by way of exemplification and not limitation with reference to the Figures.

As previously noted, a cold plate can support and cool electronic components. Embodiments of the systems and methods detailed herein relate to thermal management of electronic devices on a cold plate. Specifically, a recessed base is machined as an integral part of the cold plate to accommodate the electronic devices. The surface of the cold plate transfers the heat from the electronic devices to the liquid flowing within the body of the cold plate. The electronic devices are power dies and diodes with gate drive electronics according to an exemplary embodiment. However, the conductive heat transfer facilitated by the cold plate detailed herein is equally applicable to other electronic devices and modules that dissipate heat. Exemplary applications of these embodiments include deep space, underwater-based, and ground-based applications.

Figure 1:
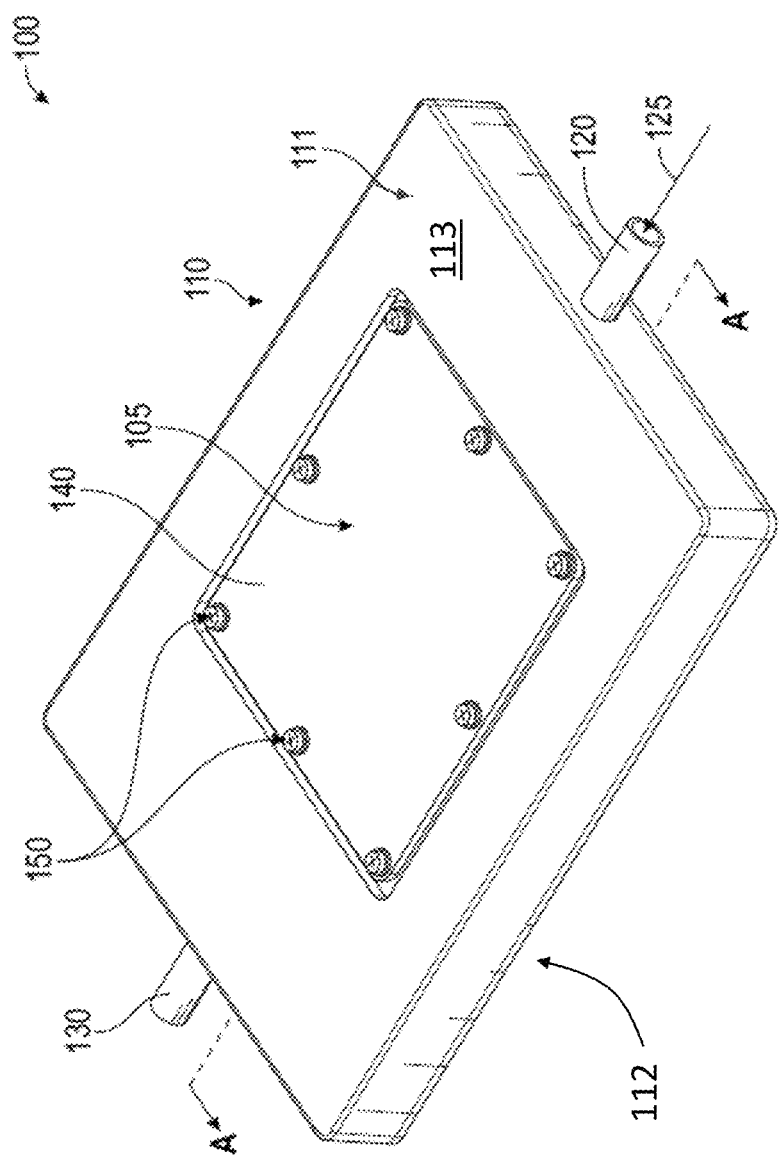

FIG. 1 is an isometric view of an exemplary cold plate assembly 100 that provides thermal management of electronic devices according to one or more embodiments. The cold plate 110 includes an inlet 120 for a coolant 125 and an outlet 130 for the coolant 125. The inlet 120 facilitates an inflow of coolant 125 through a coolant cavity 220 (FIG. 2A) within the cold plate 110. The coolant cavity 220 is formed between the cold plate 110 and the cover plate 210. Aluminum fins (not shown) may be installed inside the coolant cavity 220 and bonded to the surfaces of the coolant cavity 220 through a brazing process. When the aluminum fins are installed in the coolant cavity 220, the surfaces of the fins form flow channels. The coolant 125 enters the cold plate 110 through the inlet 120, flows through the flow channels in the coolant cavity 220 and exits through the outlet 130. As the coolant 125 flows through the flow channels of the fins, it absorbs heat from the walls of the flow channels. That is, heat from the components of the electronic assembly 105 is conducted into the coolant 125, which carries the heat out via the outlet 130. Exemplary coolants 125 include ethylene glycol with water (EGW), propylene glycol with water (PGW), and polyalphaolefin (PAO).

Figure 2A:
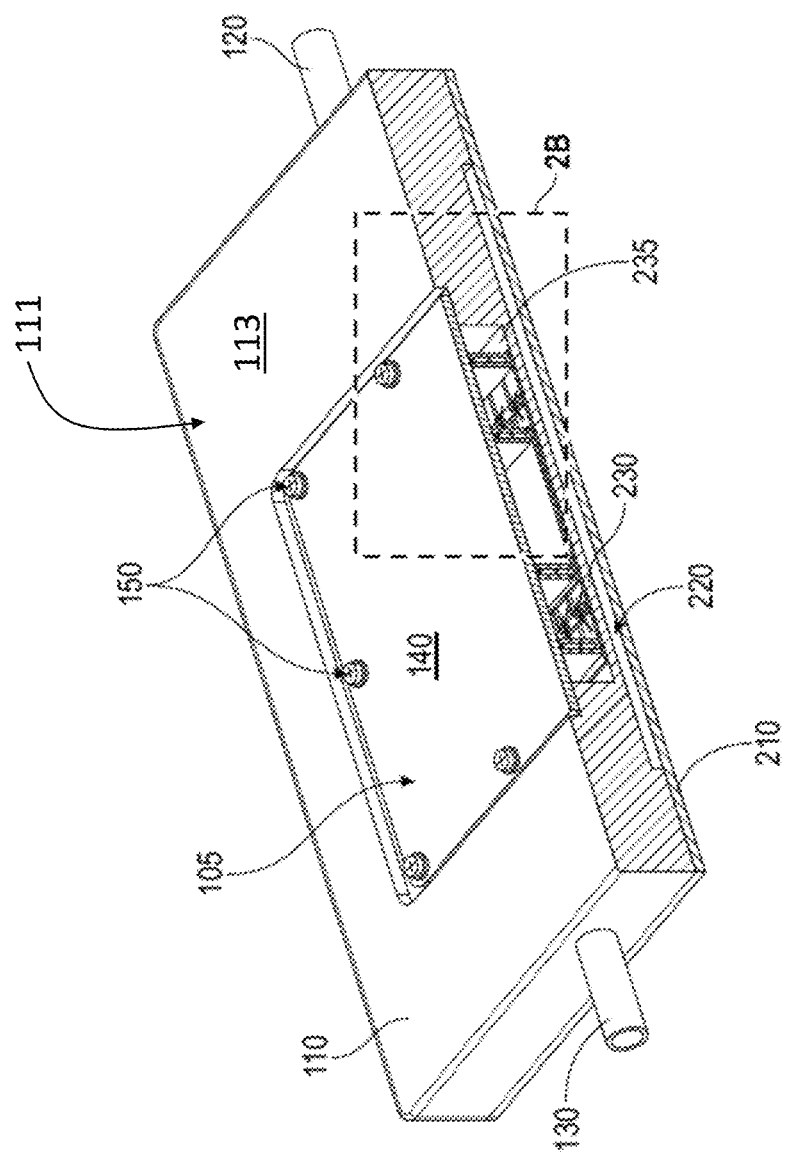
FIG. 2A shows a cross-sectional view through A-A as indicated in FIG. 1.
Figure 2B:
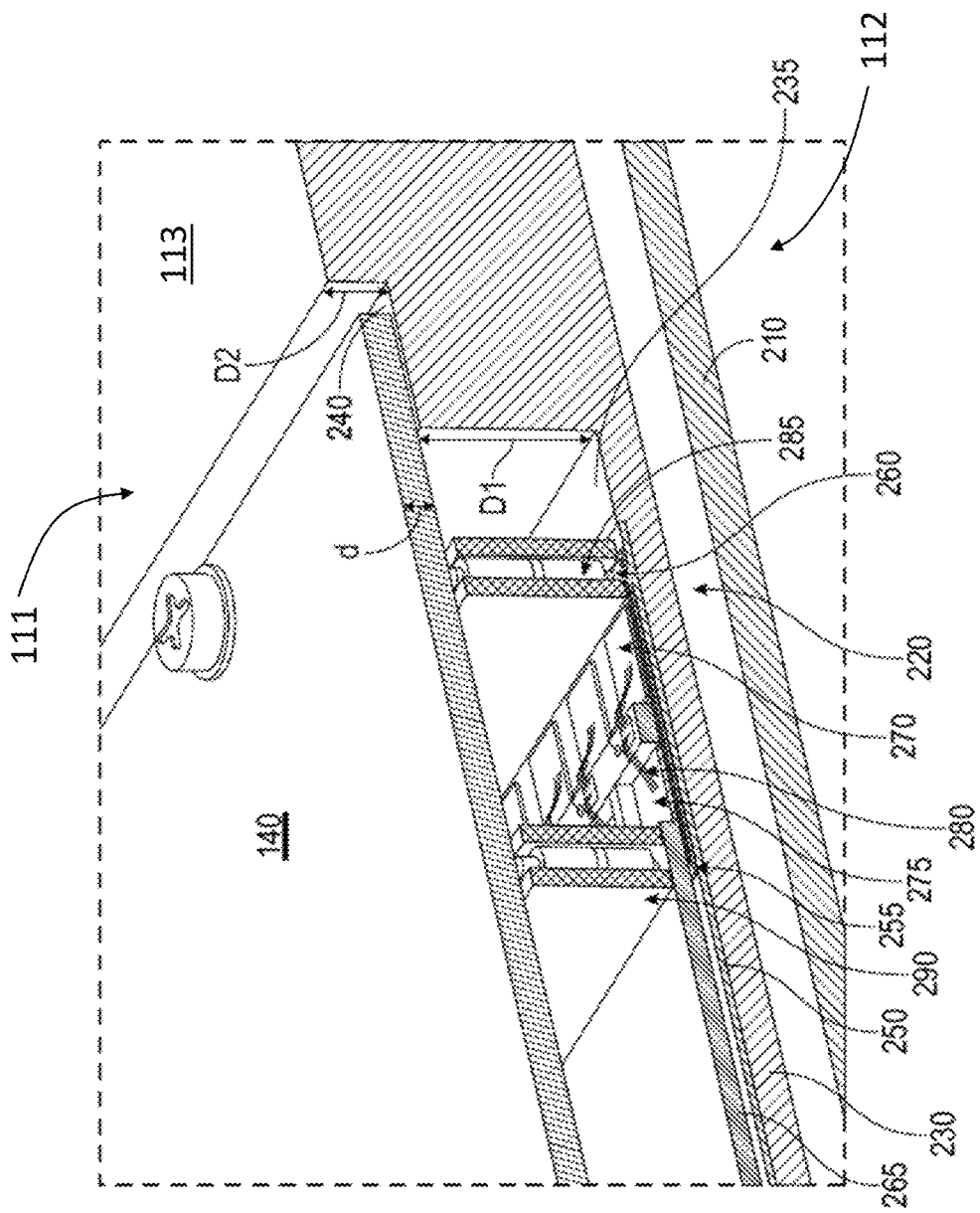
FIG. 2B is an expanded view of a portion of the cross-sectional view in FIG. 2A.

FIG. 1 shows the complete electronic assembly 105 that is fastened to the cold plate 110. Exemplary fasteners 150 (e.g., screws, bolts) through a printed wiring board (PWB) 140 of the electronic assembly 105 are indicated. The PWB 140 acts as a cover on the side 111 of the cold plate 110 that is visible in FIG. 1. A cover plate 210 (FIG. 2) on the opposite side 112 of the cold plate 110 is not visible in the view of FIG. 1. The cross-section A-A indicated in FIG. 1 is shown in FIGS. 2A and 2B. As further discussed with reference to FIGS. 2A and 2B, the electronic assembly 105 is disposed on a recessed base 230, which is a surface that is recessed from a surface 113 on the side 111 of the cold plate 110.

FIG. 2A shows a cross-sectional view through A-A as indicated in FIG. 1. The cross-sectional view shows the cover plate 210 on the opposite side 112 to side 111 of the cold plate 110. The coolant cavity 220 is indicated and is defined by the cover plate 210 on one side. As FIG. 2A shows, a portion of the coolant cavity 220 is between the cover plate 210 and the recessed base 230. The base edge 235 is less recessed that the recessed base 230 and forms a border or frame around (i.e., surrounds) the perimeter of the recessed base 230. A portion of the cross-sectional view is expanded in FIG. 2B, as indicated. Components of the electronic assembly 105 are revealed in the cross-sectional view and are discussed with reference to FIG. 2B.

FIG. 2B is an expanded view of a portion of the cross-sectional view in FIG. 2A. As FIG. 2B shows, in addition to the base edge 235 that borders the recessed base 230, a recessed edge 240 forms a border or frame around (i.e., surrounds) the perimeter of the base edge 235. Just as the base edge 235 is a surface that is less recessed than the recessed base 230, the recessed edge 240 is a surface that is less recessed than the base edge 235 from the surface 113 on the side 111. The PWB 140 rests on the recessed edge 240 and is fastened to the cold plate 110 along the recessed edge 240, as shown. On the opposite side, a base copper plate 250 is shown on the recessed base 230. The exemplary electronic assembly 105 shown in the various figures is not intended to limit the size or number of components of an electronic assembly 105 according to alternate embodiments. Thus, the recessed base 230 and the recessed edge 240 may be sized to accommodate the electronic assembly 105 for which the cold plate 110 is designed. In addition to the dimensions of the recessed base 230 being sized to fit the dimensions of the base copper plate 250, the depth D1 of the recessed base 230 from the recessed edge 240 must fit the components from the base copper plate 250 to the PWB 140, but not including the depth d of the PWB 140, and the depth D2 of the recessed edge 240 must accommodate the depth d of the PWB 140.

A ceramic plate 255 is placed on the base copper plate 250 at each end of the electronic assembly 105. Two copper plates 260 are disposed on each ceramic plate 255. The numbers and sizes of the ceramic plate 255 and copper plate 260 are not limited by this exemplary embodiment. A gate drive PWB 265 spans the two ends of the electronic assembly 105. As shown, power dies 270 and diodes 275 are arranged on each of the copper plates 260. These are connected to the gate drive PWB 265 by bond wires 280. Spring-loaded electrical contacts 285 held in holders 290 carry input current between the PWB 140 and the power dies 270. The PWB 140 includes power routing and filtering for high current connections. As previously noted, the fasteners 150 fasten the PWB 140 to the cold plate 110. This results in a compressive force being applied to the spring-loaded electrical contacts 285. The electronic components are more clearly visible in subsequent views.

Figure 3A:
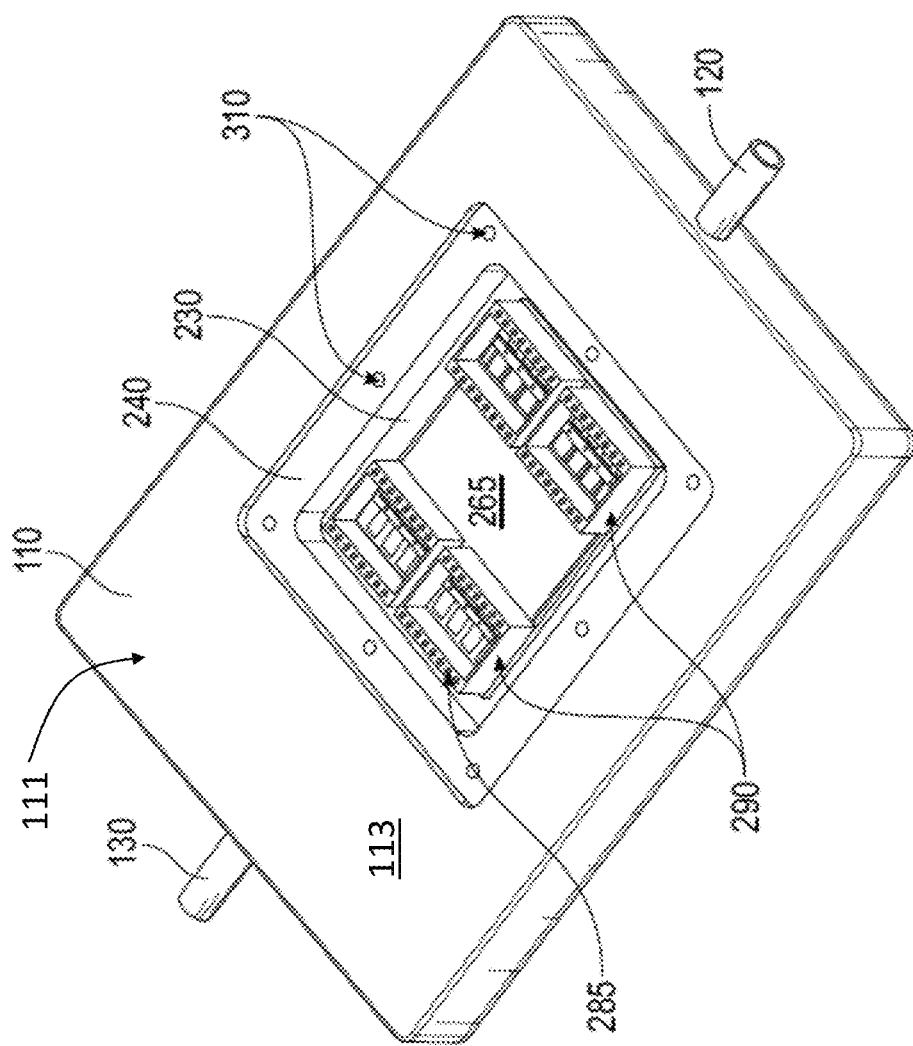
FIG. 3A shows an isometric view resulting from removing a printed wiring board (PWB) from the electronic assembly of the exemplary cold plate assembly.

FIG. 3A shows an isometric view resulting from removing the PWB 140. Removal of the PWB 140 exposes the spring-loaded electrical contacts 285 in the holders 290. In the exemplary embodiment shown in FIG. 3A, two holders 290 are disposed at each end for a total of four holders 290. In addition to the components shown and discussed, additional electronic devices (e.g., microcircuits, transformers) may be mounted on the gate drive PWB 265. The gate drive PWB 265 provides low impedance drive signals to the power dies 270 and may also be used for signal conditioning. In addition, holes 310 along the recessed edge 240 are visible. According to an exemplary embodiment, these are screw holes and the fasteners 150 are screws.

Figure 3B:
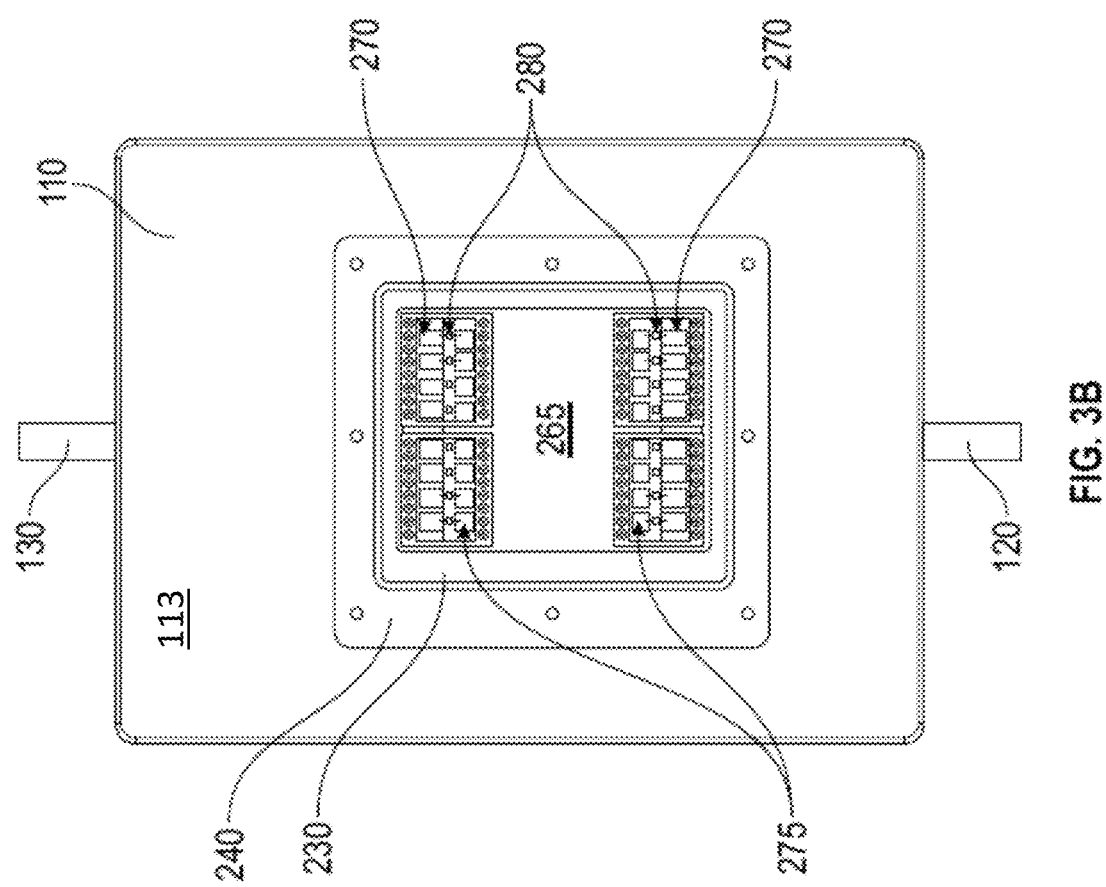
FIG. 3B shows a top view of the cold plate assembly without the PWB.

FIG. 3B shows a top view of the cold plate assembly 100 without the PWB 140. The power dies 270, diodes 275, and bond wires 280 that extend from the power dies 270 and diodes 275 to the gate drive PWB 265 are shown. As the view in FIG. 3B clarifies, each holder 290 essentially forms a frame around a set of power dies 270 and diodes 275 mounted on a copper plate 260 and holds the spring-loaded electrical contacts 285 that carry the input current between the power dies 270 and the PWB 140. In the exemplary embodiment shown in FIG. 3B, each of the four holders 290 frames four pairs of power dies 270 and diodes 275. As previously noted, the cold plate 110 removes heat from the cold plate assembly 100 via the coolant 125. Thus, the cold plate 110 acts as the heat sink. The power dies 270 and diodes 275 are the heat source.

Figure 4A:
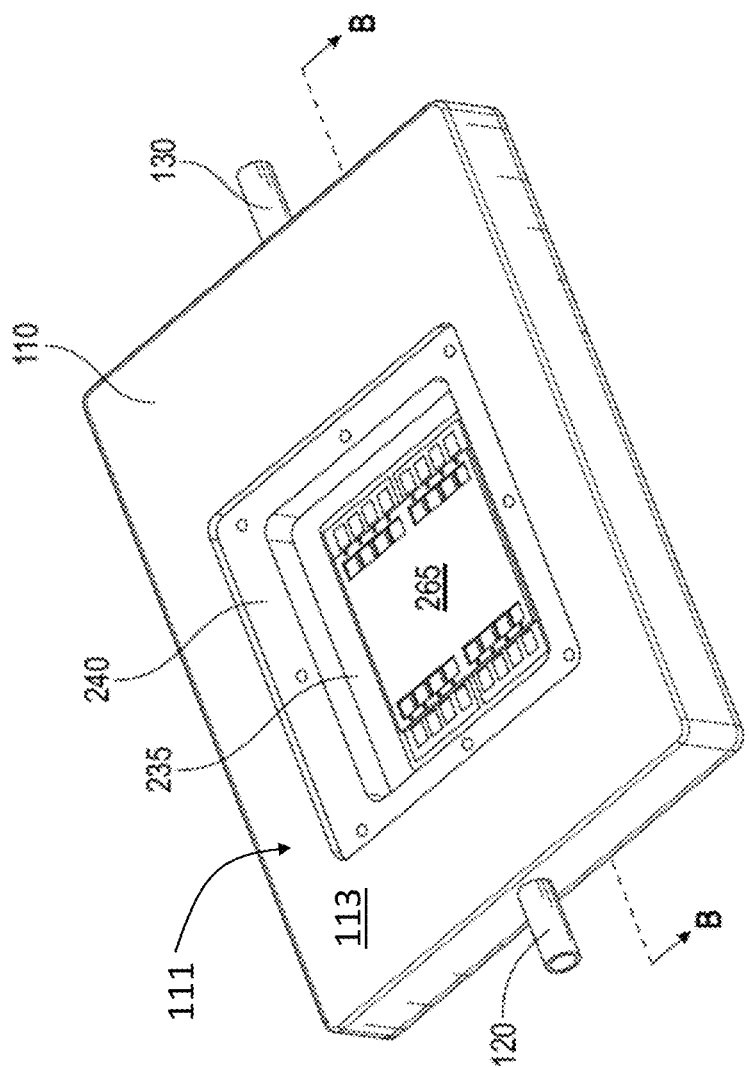
FIG. 4A shows an isometric view resulting from removing spring-loaded electrical contacts and holders from the electronic assembly in FIG. 3A.

FIG. 4A shows an isometric view resulting from removing the spring-loaded electrical contacts 285 and holders 290 from the view in FIG. 3A. The cross-section B-B indicated in FIG. 4A is shown in FIG. 4B.

Figure 4B:
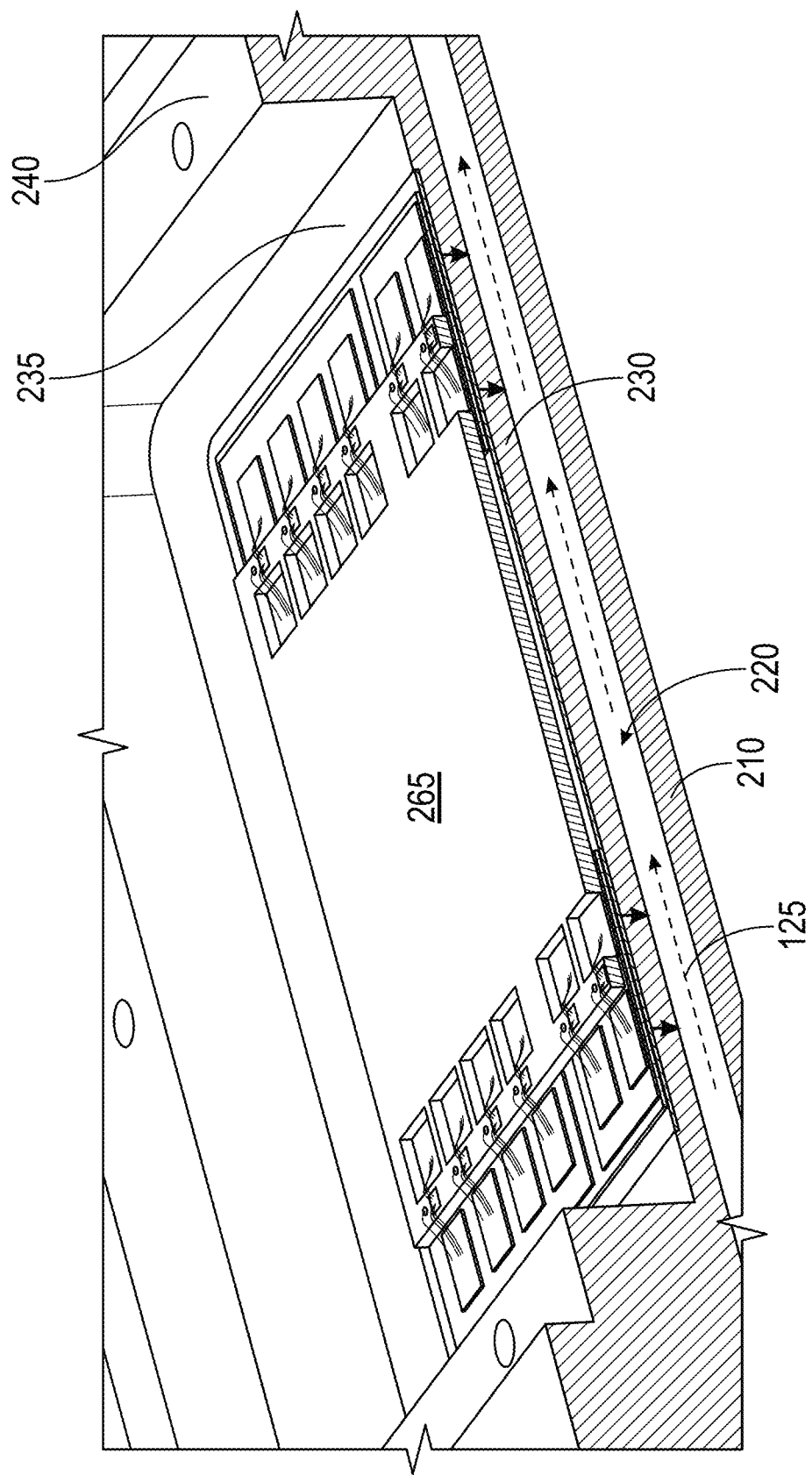
FIG. 4B shows a cross-sectional view through B-B as indicated in FIG. 4A.

FIG. 4B shows a cross-sectional view through B-B as indicated in FIG. 4A. The cold plate 110 and the cover plate 210 of the cold plate 110 may be aluminum or aluminum alloy. In addition, the coolant cavity 220 may include aluminum fins to channel the coolant 125 from the inlet 120 to the outlet 130. As previously noted, the coolant 125 removes heat from the cold plate assembly 110. Specifically, as indicated by the downward arrows in FIG. 4B, the heat flows from the power dies 270 and diodes 275 by conduction through the different layers and interfaces into the coolant 125. As shown by the dashed arrows in FIG. 4B, the coolant 125 flows in the flow channels of the coolant cavity 220 and carries away the heat from the heat sources (i.e., power dies 270 and diodes 275). This heat from the heat sources is transferred to the coolant 125 via a number of thermal interfaces, as discussed with reference to FIG. 5.

Figure 5:
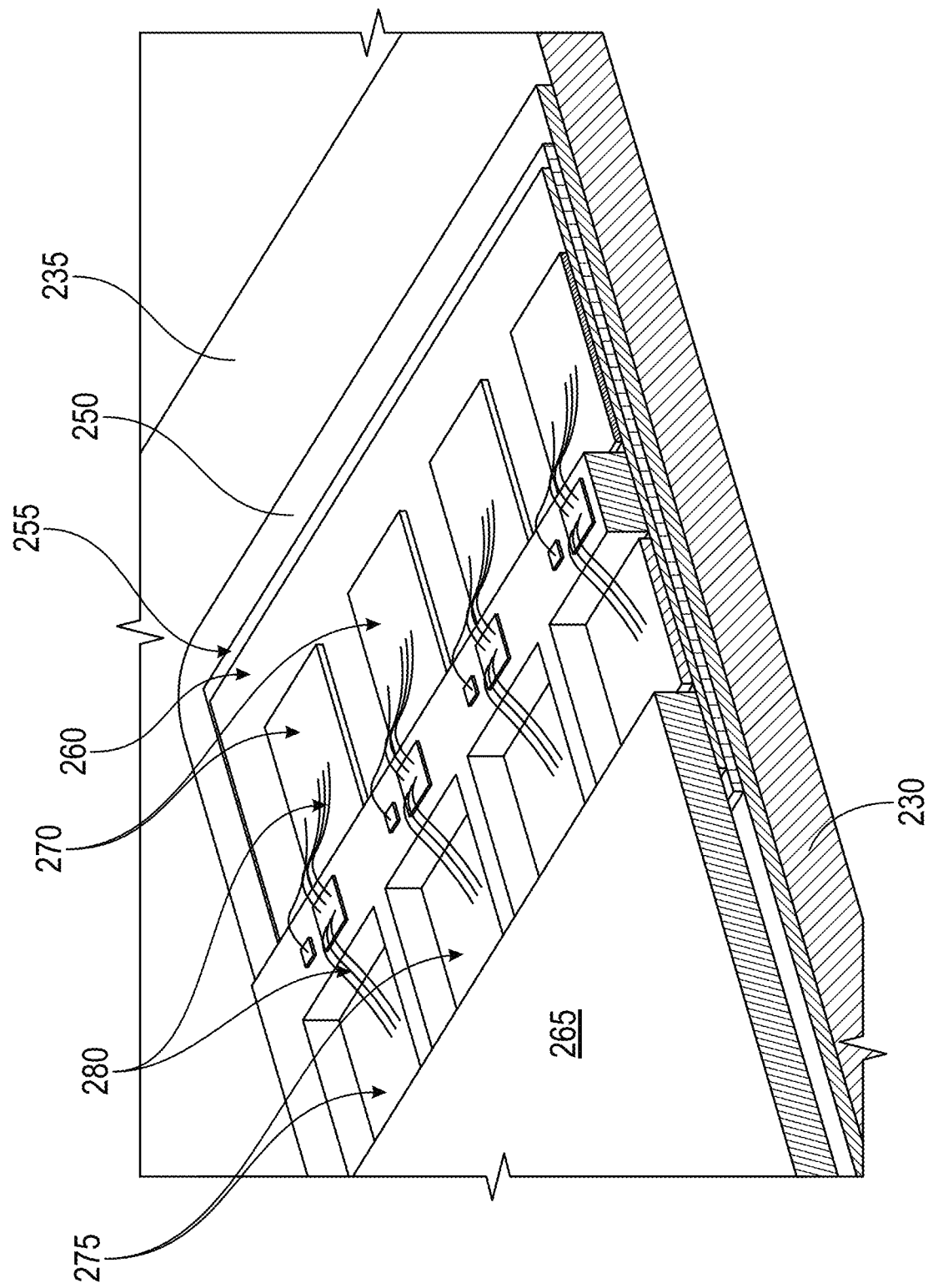

FIG. 5 is an expanded view of aspects of the cross-sectional view shown in FIG. 4B. The coolant cavity 220 and cover plate 210 below the recessed base 230 are not shown. There are four thermal interfaces involved in transferring heat from the heat sources to the recessed base 230. That is, heat from the heat sources (e.g., power dies 270 and diodes 275) is conducted through four thermal interfaces to the heat sink (i.e., coolant 125). The first is an interface between the devices themselves (e.g., power dies 270 and diodes 275) and the corresponding copper plate 260 on which they are disposed. The power dies 270 and diodes may be soldered to a copper plate 260 to reduce thermal interface resistance between the power devices and the copper plate 260. The second thermal interface is between the copper plate 260 and the ceramic plate 255. Each copper plate 260 may be bonded to one of the ceramic plates 255 using a direct bonding of copper (DBC) technique.

The third thermal interface is between each ceramic plate 255 and the base copper plate 250. Each ceramic plate 255 may be bonded to the base copper plate 250 using the DBC technique. The fourth thermal interface is between the base copper plate 250 and the recessed base 230 and is further discussed with reference to FIGS. 6A and 6B. The base copper plate 250 may be bonded to the recessed base 230 of the cold plate 110 through soldering, brazing, DBC, diffusion bonding, or another technique that reduces thermal interface resistance. With regard to all four thermal interfaces, the use of materials with relatively high thermal conductivity and low thickness and the use of bonding techniques that result in relatively lower thermal interface resistance facilitate maximizing the heat that is transferred and, thereafter, dissipated from the cold plate assembly 100. Sufficient heat dissipation from the power devices facilitates maintain the junction temperature of the devices below their maximum levels. This, in turn, allows the use of high power silicon carbide and diodes.

Figure 6A:
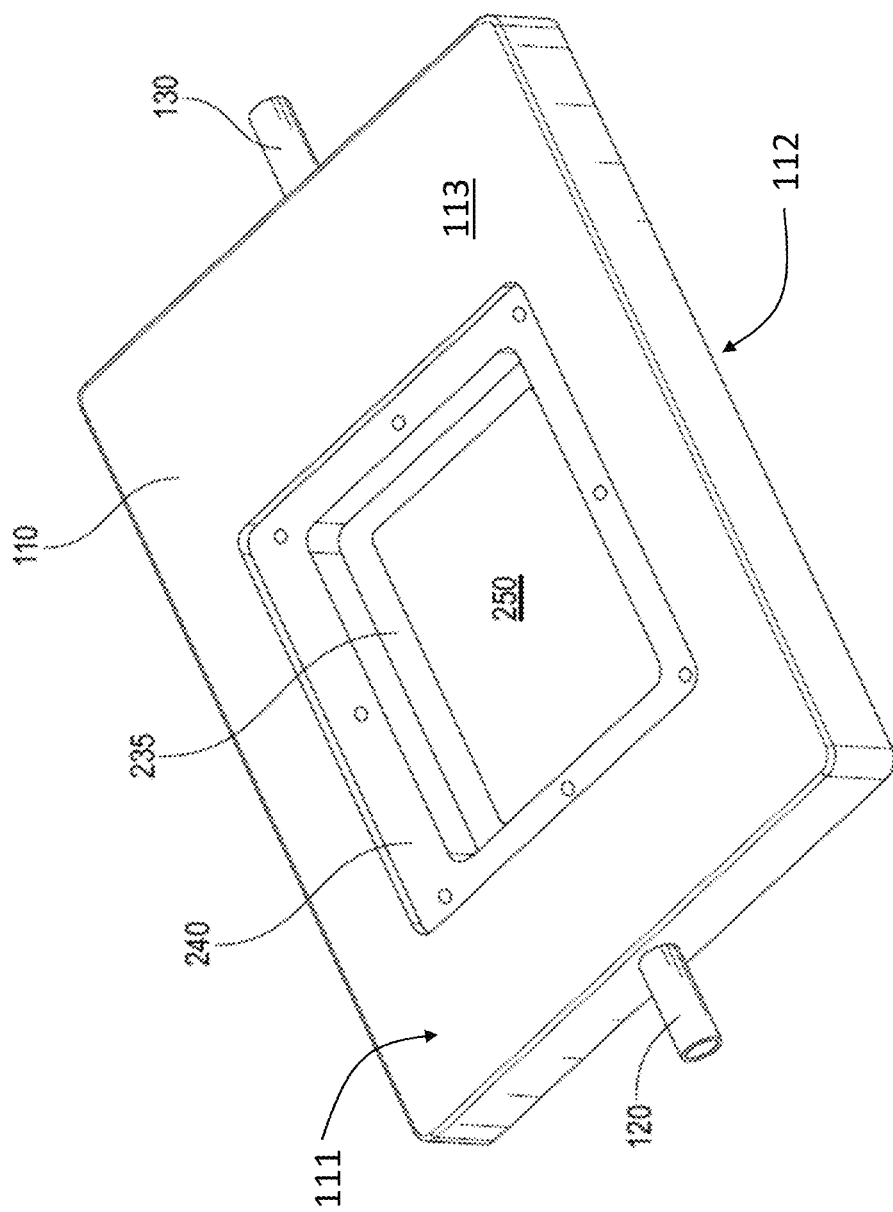
FIG. 6A is an isometric view of the cold plate with a base copper plate of the electronic assembly.

FIG. 6A is an isometric view of the cold plate 110 with the base copper plate 250. The base edge 235 around the perimeter of the base copper plate 250 and the recessed edge 240 around the base edge 235 are clearly visible. As previously noted, the base copper plate 250 may be bonded to the recessed base 230 of the cold plate 110 through soldering or brazing. The recessed base 230 may be nickel-plated or tin-plated to facilitate the soldering or brazing.

Figure 6B:
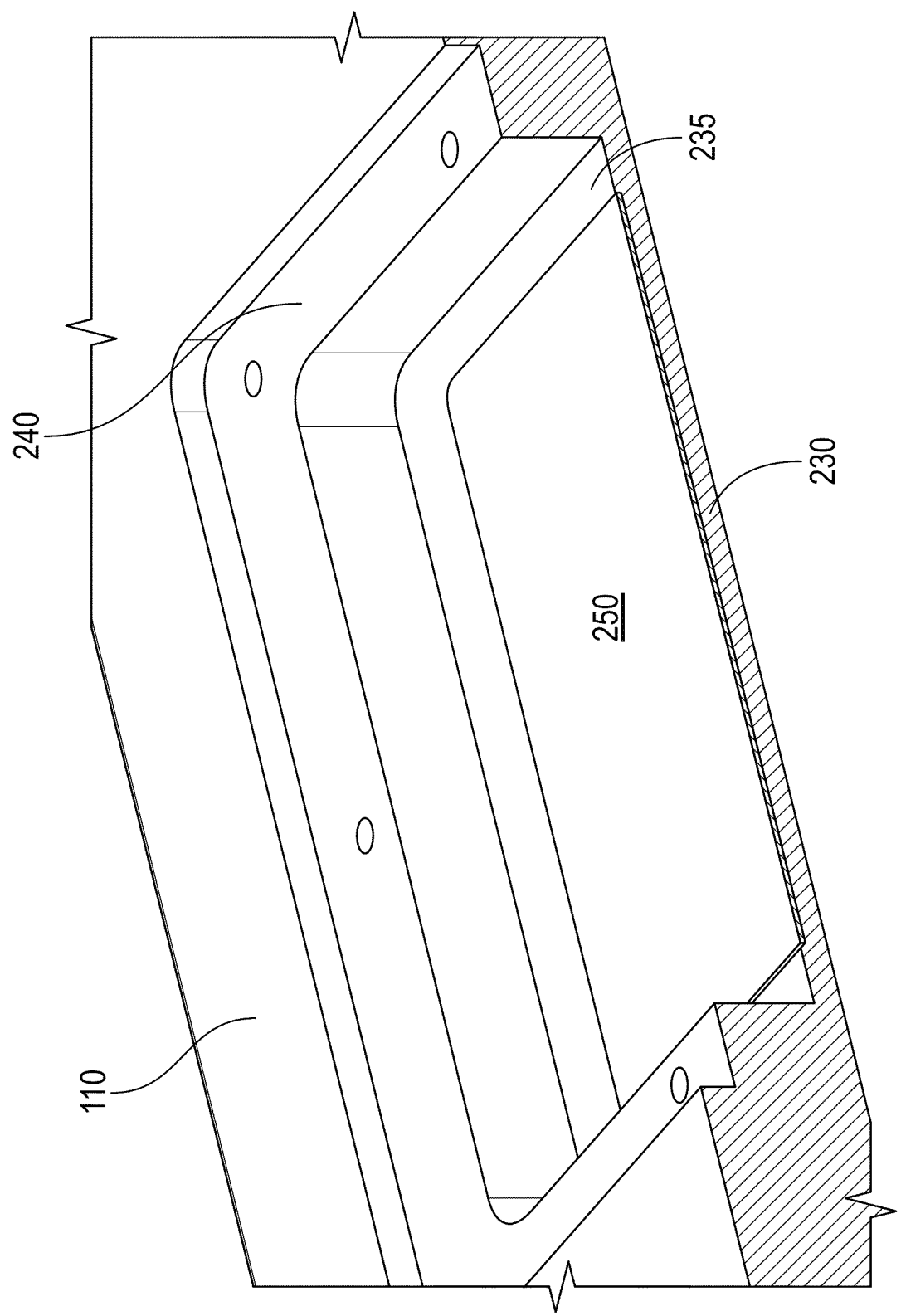
FIG. 6B is a cross-sectional expanded view of the cold plate with the base copper plate shown in FIG. 6A.

FIG. 6B is a cross-sectional expanded view of the cold plate 110 with the base copper plate 250. The thermal interface between the base copper plate 250 and the recessed base 230 experiences reduced thermal interface resistance based on tight bonding between the base copper plate 250 and the recessed base 230. The lower the thermal interface resistance, the greater the dissipation of heat from the base copper plate 250, which originates at the heat sources, to the heat sink (i.e., coolant 125) below the recessed base 230.

Figure 7:
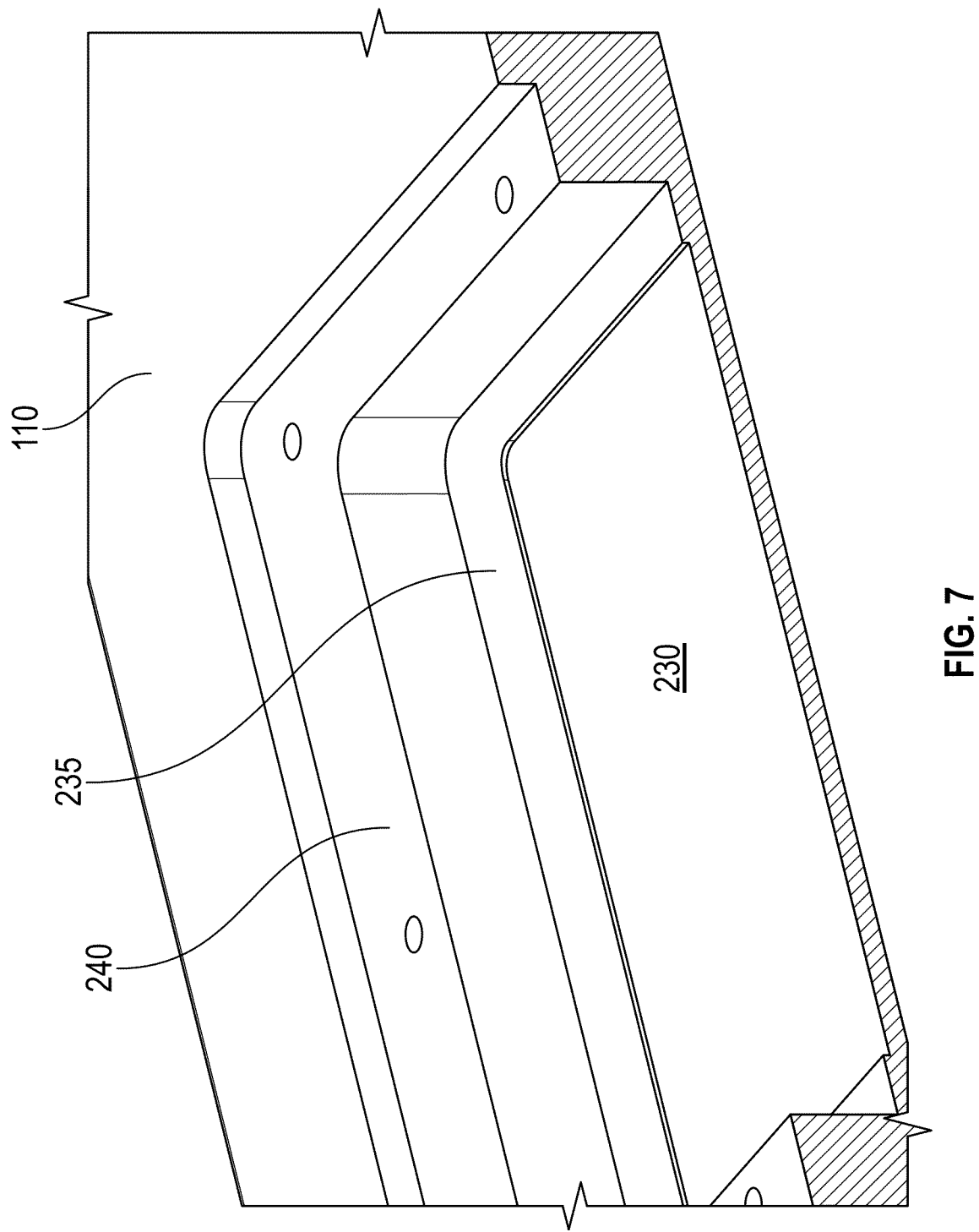

FIG. 7 is a cross-sectional view of the cold plate 110. The recessed edge 240, the base edge 235, and the recessed base 230 result from machining. The thinnest part of the cold plate 110 is the recessed base 230. This facilitates heat transfer to the coolant 125 that flows in the coolant cavity 220 below the recessed base 230.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A cold plate comprising:
   a first side with a first surface;
   a second side, opposite the first side, affixed to a cover plate;
   a coolant cavity formed between the first side and the cover plate;
   a recessed base machined into the first surface of the first side, wherein the recessed base is configured to bond with a base copper plate of an electronic assembly and is a surface of a thinnest portion of the cold plate; and
   a base edge machined into the first surface of the first side, wherein the base edge is a surface that forms a border around a perimeter of the recessed base, wherein the base edge is less recessed from the first surface than the recessed base.

2. The cold plate according to claim 1, further comprising an inlet configured to channel coolant into the coolant cavity on a first side of the coolant cavity.

3. The cold plate according to claim 2, further comprising an outlet configured to channel the coolant out of the coolant cavity on a second side, opposite the first side, of the coolant cavity.

4. The cold plate according to claim 1, further comprising a recessed edge machined into the first surface of the first side, wherein the recessed edge is a surface that forms a border around a perimeter of the base edge.

5. The cold plate according to claim 4, wherein the recessed edge is less recessed from the first surface than the base edge.

6. The cold plate according to claim 4, wherein the recessed edge includes holes corresponding to fasteners configured to fasten an electronic assembly seated on the recessed base to the cold plate.

7. The cold plate according to claim 1, wherein the cold plate is machined from aluminum.

8. The cold plate according to claim 1, wherein the cold plate is machined from aluminum alloy.

9. A method of fabricating a cold plate, the method comprising:
   machining a coolant cavity between a first side with a first surface and a cover plate affixed to a second side, opposite the first side;
   machining a recessed base into the first surface of the first side, wherein the recessed base is configured to bond with a base copper plate of an electronic assembly and is a surface of a thinnest portion of the cold plate; and
   machining a base edge into the first surface of the first side, wherein the base edge is a surface that forms a border around a perimeter of the recessed base, wherein the machining the base edge includes machining the base edge to be less recessed from the first surface than the recessed base.

10. The method according to claim 9, further comprising forming an inlet configured to channel coolant into the coolant cavity on a first side of the coolant cavity.

11. The method according to claim 10, further configured forming an outlet configured to channel the coolant out of the coolant cavity on a second side, opposite the first side, of the coolant cavity.

12. The method according to claim 9, further comprising machining a recessed edge into the first surface of the first side, wherein the recessed edge is a surface that forms a border around a perimeter of the base edge.

13. The method according to claim 12, wherein the machining the recessed edge includes machining the recessed edge to be less recessed from the first surface than the base edge.

14. The method according to claim 12, further comprising forming holes in the recessed edge corresponding to fasteners configured to fasten an electronic assembly seated on the recessed base to the cold plate.

15. The method according to claim 9, wherein the fabricating the cold plate includes machining aluminum or aluminum alloy.

16. A system comprising:
   a cold plate comprising:
      a first side with a first surface,
      a second side, opposite the first side, affixed to a cover plate,
      a coolant cavity formed between the first side and the cover plate;
      a recessed base machined into the first surface of the first side, wherein the recessed base is a surface of a thinnest portion of the cold plate;
      a base edge machined into the first surface of the first side, wherein the base edge is a surface that forms a border around a perimeter of the recessed base, wherein the base edge is less recessed from the first surface than the recessed base; and
   an electronic assembly seated on the recessed base, the electronic assembly including a base copper plate that is bonded to the recessed base, power dies, and diodes.

* * * * *